(12) United States Patent
Novak et al.

(10) Patent No.: US 6,674,512 B2
(45) Date of Patent: Jan. 6, 2004

(54) INTERFEROMETER SYSTEM FOR A SEMICONDUCTOR EXPOSURE SYSTEM

(75) Inventors: W. Thomas Novak, Hillsborough, CA (US); David Stumbo, Belmont, CA (US); Fuyuhiko Inoue, San Mateo, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/924,071

(22) Filed: Aug. 7, 2001

(65) Prior Publication Data

US 2003/0063267 A1 Apr. 3, 2003

(51) Int. Cl.[7] .................. G03B 27/54; G03B 27/42; G03B 27/32; G03F 9/00; G01B 11/02
(52) U.S. Cl. .................. 355/67; 355/53; 355/55; 355/77; 430/5; 430/22; 430/311; 430/312; 356/356; 356/357; 356/363
(58) Field of Search ................ 355/53, 55, 67, 355/77; 430/5, 22, 311, 312; 356/356, 357, 363

(56) References Cited

U.S. PATENT DOCUMENTS

| | | | |
|---|---|---|---|
| 4,215,938 A | 8/1980 | Farrand et al. | 356/358 |
| 5,114,234 A | 5/1992 | Otsuka et al. | 356/358 |
| 5,151,749 A | 9/1992 | Tanimoto et al. | |
| 5,187,543 A | 2/1993 | Ebert | 356/349 |
| 5,365,342 A | * 11/1994 | Ayata et al. | |
| 5,379,115 A | 1/1995 | Tsai | 356/351 |
| 5,392,120 A | 2/1995 | Kamiya | 356/358 |
| 5,504,407 A | 4/1996 | Wakui et al. | |
| 5,523,839 A | 6/1996 | Robinson et al. | 356/349 |
| 5,528,118 A | 6/1996 | Lee | 318/568 |
| 5,537,209 A | 7/1996 | Lis | 356/349 |
| 5,677,758 A | 10/1997 | McEachern et al. | |
| 5,715,064 A | 2/1998 | Lin | |
| 5,724,136 A | 3/1998 | Zanoni | 356/349 |
| 5,790,253 A | 8/1998 | Kamiya | |
| 5,969,441 A | 10/1999 | Loopstra et al. | |
| 5,991,034 A | * 11/1999 | Ohtsuka | |
| 6,020,964 A | 2/2000 | Loopstra et al. | 356/358 |
| 6,118,515 A | 9/2000 | Wakamoto et al. | |
| 6,262,796 B1 | 7/2001 | Loopstra et al. | |
| 6,313,918 B1 | * 11/2001 | Hill et al. | |
| 6,400,441 B1 | 6/2002 | Nishi et al. | |
| 6,417,914 B1 | 7/2002 | Li | |
| 2002/0026878 A1 | 3/2002 | Kwan et al. | |
| 2003/0076482 A1 | 4/2003 | Inoue | |

FOREIGN PATENT DOCUMENTS

| | | |
|---|---|---|
| EP | 1 041 357 A1 | 10/2000 |
| WO | WO 98/40791 | 9/1998 |
| WO | WO 99/32940 | 7/1999 |

OTHER PUBLICATIONS

Van Zant, "Microchip Fabrication, A Practical Guide to Semiconductor Processing", Fourth Edition, McGraw–Hill, pp. 236 and 611.

* cited by examiner

Primary Examiner—Frank G. Font
Assistant Examiner—Khaled Brown
(74) Attorney, Agent, or Firm—Pennie & Edmonds LLP

(57) ABSTRACT

An interferometer measuring system comprising two moveable members and a reference member that may have significantly less movement, the group having a number of attached measurement mirrors, interferometers for measuring position and two optical support blocks for the interferometers. The interferometers are used to determine the measured optical path lengths to each of the moveable members and reference member and these positions are used to calculate the misalignment, or error in the relative positions of the moveable members with respect to the reference member. This calculated error is then used to correct the misalignment by moving the appropriate members in the manner directed by the calculation.

43 Claims, 3 Drawing Sheets

INTERFEROMETER SYSTEM FOR A SEMICONDUCTOR EXPOSURE SYSTEM

FIELD OF THE INVENTION

The present invention relates generally to an interferometer system for position measurement, and more specifically, to an interferometer system and method for improving the accuracy of interferometric measurements.

BACKGROUND OF THE INVENTION

Often a semiconductor exposure system used to manufacture semiconductor devices uses a laser interferometer to accurately measure relative displacement between two members. For example, the laser interferometer is used as an apparatus for measuring the coordinates of a wafer stage (i.e. substrate stage) or reticle stage to facilitate highly accurate positioning of a semiconductor wafer or reticle relative to stationary projection optics.

FIGS. 1 and 2 show a prior art laser interferometer system. The interferometer system typically measures a change in position of measurement mirrors Mx, My attached to movable stage S relative to stationary reference mirror MR attached to projection lens PL. A laser source generates beam B of light, part of which is reflected from reference mirror MR and part of which is reflected from measurement mirror Mx (FIG. 2). The light reflected from mirrors Mx, MR is then combined and reflected into sensor SR. If measurement mirror Mx moves relative to reference mirror MR, the intensity of the combined beam periodically increases and decreases as the reflected light from the two paths alternately interferes constructively and destructively. This constructive and destructive interference is caused by the two beams moving in and out of phase.

In principle, each half wavelength of movement of the measurement mirror results in a total optical path change of one wavelength and thus, one complete cycle of intensity change. The number of cycle changes indicates the number of wavelengths that the measurement mirror has moved. Therefore, by counting the number of times the intensity of the light cycles between darkest and lightest, the change in position of the measurement mirror can be estimated as an integral number of wavelengths. The simple counting of light cycles, however, does not divulge in what direction the mirrors are moving.

Actual interferometers are more complicated to be able to determine the direction of movement. This information is determined in a number of ways that may include, for example, comparing the interference pattern from light of two different wavelengths. And, while data may be processed using a central processing unit, there are also interferometers that output their data optically and therefore do not communicate with a computer in the same manner.

Interferometer design also may vary in the placement of certain functional elements. For example, in FIGS. 1 and 2, if the reference mirror MR were positioned a fixed distance from sensor SR (i.e. not on projection lens PL) and only measurement mirror Mx could move relative to sensor SR and reference mirror MR, the interferometer would be a type of "absolute interferometer." An absolute interferometer measures the movement of the measurement mirror. A differential interferometer, however, determines the relative movement between measurement mirror Mx and reference mirror MR where either mirror can move relative to sensor SR. A differential interferometer does not determine which mirror moves, just that one mirror moved in relation to the other. Therefore it does not produce enough information to determine the movement of either mirror relative to a third object without some modification. The interferometer shown in FIGS. 1 and 2 is one such differential interferometer.

As manufacturers of integrated circuits attempt to increase circuit density and reduce circuit feature size in the devices manufactured, interferometers are required to provide more precise measurement data. The precision with which interferometers provide position control has been improved by technical advances in the design of various optical components including lasers and photosensors. But the performance of interferometers is still limited by changes in optical path length due to environmental disturbances, such as thermal expansion, that cause movement of the optical components of the interferometer system. When optical components, such as beam splitter BS, tilt or rotate for any reason whatsoever the distance between reference mirror MR and beam splitter BS changes (FIG. 2). This movement of beam splitter BS causes an error in the position measurement of stage S which results in misalignment of circuit patterns on wafer W relative to one another.

Current interferometer systems fail to account for the rotation of elements within the interferometer system. In particular, see FIG. 3., where interferometers directed to reticle stage (not shown) and wafer stage S are mounted on different blocks. For the purposes of this discussion and this patent in general these blocks are considered rigid bodies and the interferometer elements mounted on them are considered rigidly mounted. But these blocks are not rigidly joined to each other and any relative movement of these blocks will cause the interferometer to produce inaccurate data for the position of wafer W relative to reticle R. Such inaccuracy leads to poor product because the image from reticle R is not in its intended position on wafer W. Current interferometer systems do not and can not compensate for relative rotation of the blocks because they do not contain the means necessary to determine what that movement is.

Precise positioning of the circuit patterns is desired to prevent an imperfect final product, a potential decrease in process yield, and a corresponding increase in manufacturing costs. There is, therefore, a need for an interferometer system with the improved capability to determine and compensate for undesired rotation of the optical components of the interferometer system.

SUMMARY OF THE INVENTION

The present invention overcomes deficiencies of the prior art by providing an interferometer measuring system that uses the interferometer system itself to compensate for movement of both the optical components and the moveable members (e.g. wafer and reticle stages) within the system. With interferometer systems that measure the stage position and attitude (rotation and tilt) of a projection exposure device, the optical components (interferometer support blocks) of the interferometer system itself tilt or rotate due to body deformation, so reticle and wafer stage position measurement errors occur. The present invention measures the position and attitude of components within the interferometer system using the interferometer system itself, and uses this to compensate for errors that occur, providing an interferometer system that can position the components of the projection exposure device with higher precision than conventional systems.

The invention next uses the known relative movement between interferometer support blocks and a reference member to adjust the positions of the other moveable members that have been measured by the optical components on both blocks. Finally, after determining the relative movement of both optical components and moveable members, the invention compensates for undesired movement of the moveable members.

The interferometer measuring system of a preferred embodiment of the present invention generally comprises, for example, in any single plane, two movable members with attached mirrors, one reference member with attached mirror, two optical support blocks, and the light sources, splitters and reference mirrors necessary for eight interferometer axes arrayed appropriately on the optical support blocks. On the first optical block, two interferometer beams are directed toward the first movable member, and two interferometer beams are directed toward the reference member. Similarly, on the second optical block, two interferometer beams are directed towards the second moveable member, and two interferometer beams are directed toward the reference member. In this preferred embodiment the movable members are a reticle stage and a wafer stage and the reference member is the projection lens. It should be noted that, since the positions of the moveable members are determined relative to the reference member, the reference member could also move and the invention would still compensate for undesired movement of the moveable members relative thereto. Thus, the reference member is also considered a moveable member.

A method employing the present invention finds the positions of a plurality of movable members relative to each other and accounts and compensates for undesired movement of the movable members and interferometer system components. This method generally comprises first sensing the change in position of two points on each of a plurality of the movable members; calculating the relative change in position of a plurality of the movable members based on the sensed positions; and compensating for undesired movement.

Where the interferometer system includes interferometers mounted on multiple blocks, relative movement between two blocks is determined by having additional steps where the interferometers from each block sense the position of a reference moveable member; then re-define the other moveable members' positions in terms showing their position relative to the reference moveable member. The method can include a step in which a controller then compensates for undesired movement.

The above is a brief description of some deficiencies in the prior art and advantages of the present invention. Other features, advantages, and embodiments of the invention will be apparent to those skilled in the art from the following description, drawings, and claims.

BRIEF DESCRIPTION OF THE DRAWINGS

Corresponding reference characters indicate corresponding parts throughout the several views of the drawings.

DESCRIPTION OF THE INVENTION

An interferometer system according to the present invention determines relative displacement and rotation of the optical elements and repositions the movable elements, or provides direction for their repositioning, accounting for the aforementioned movements of the optical elements. Thus, the invention provides the potential to control more precisely the positions of the wafer and reticle in an exposure device. This greater precision permits improved accuracy in circuit patterns on the wafer.

Interferometer systems of the prior art are known to determine reticle and wafer stage displacement and rotation relative to the projection lens using interferometers as described in the background section. The prior art, however, does not determine whether the optical components of the interferometer system have themselves moved. The present invention, on the other hand, coordinates these determinations to create a system whereby wafer stage and reticle positions are both known with respect to projection lens while accounting for displacement and rotation of the interferometer optical components.

Figure 1:
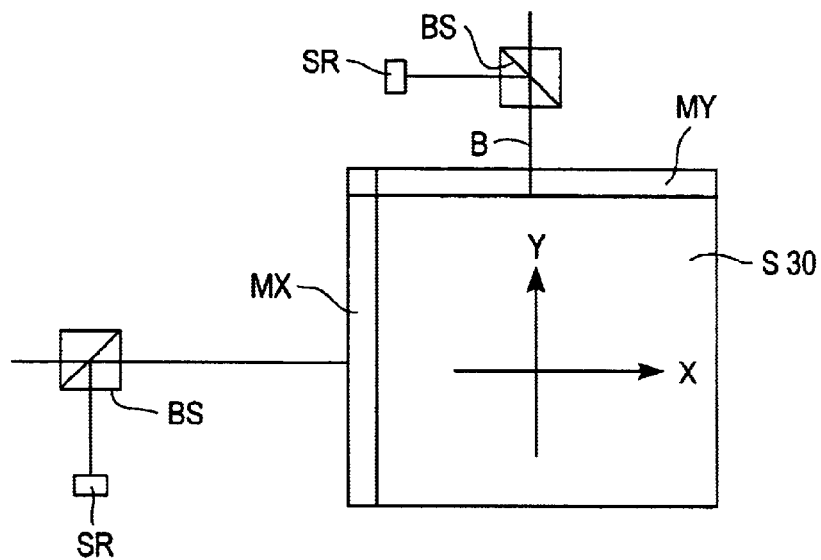
FIG. 1 is a plan view of a prior art interferometer system for measuring position of a stage movable in x and y directions.
Figure 2:
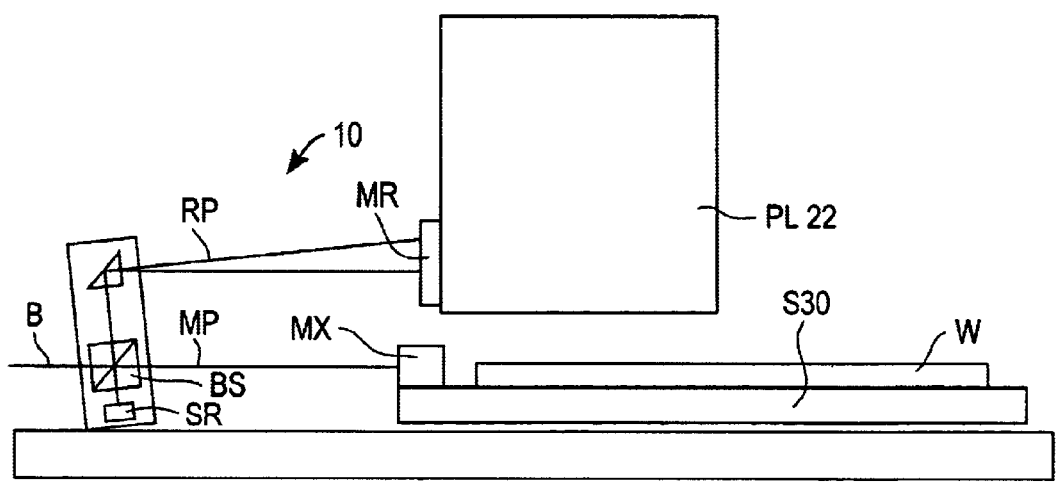
FIG. 2 is a side view of the prior art interferometer system of FIG. 1 showing rotation of optical components of the system.
Figure 3:
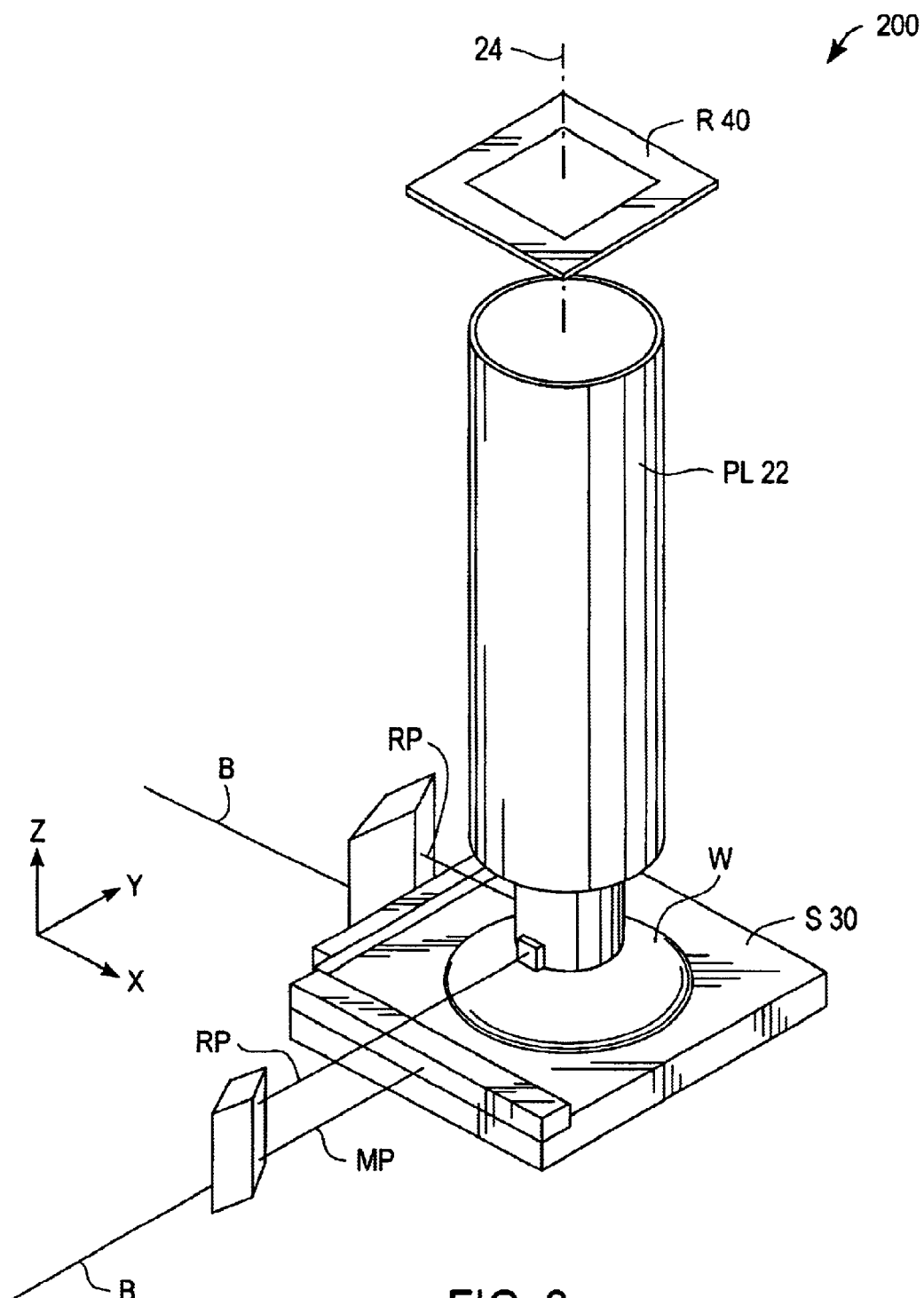
FIG. 3 is a perspective of a portion of prior art interferometer system of FIGS. 1 and 2 applied to a wafer stage of a projection type exposure apparatus.
Figure 4:
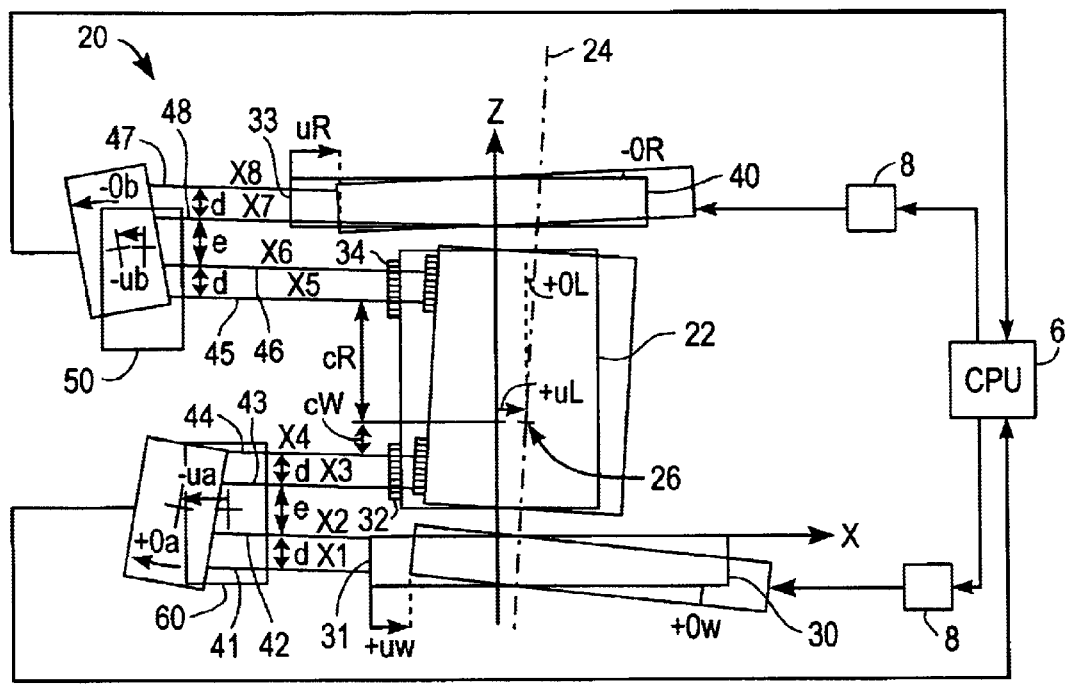
FIG. 4 is a side view of the XZ plane component of an interferometer system of the present invention.

To account for movements in the optical components of the interferometer system, the preferred embodiment of the present invention utilizes in each reference plane an eight beam interferometer system in conjunction with the normally existing central processing unit 6 and stage controllers 8 as illustrated in FIG. 4. The interferometers measure optical path length change for the beams directed at the movable members (projection lens assembly 22, wafer stage 30 and reticle stage 40) from the optical components (interferometer blocks 50, 60) in a single plane, for example, the XZ plane. Interferometer mirrors 31, 32, 33 and 34 are mounted on reticle stage 40, wafer stage 30 and projection lens assembly 22 as known in the art. The measured optical path length change data is processed by CPU 6 to determine both wafer stage and reticle displacement and rotation with respect to the projection lens assembly should either stage and/or the blocks upon which the interferometers are mounted change position. Controllers 8 adjust the position of the system components in response to correction information generated by CPU 6.

Another eight beam interferometer system (in addition to the existing central processing unit and stage controllers) may be employed to perform the similar function in the YZ plane and/or XY plane if desired. While the movement of the system components is in three dimensions, the description herein is limited to a single plane, i.e. as a two dimensional phenomena, in order to clarify the operation of the invention. Persons of ordinary skill in the art will appreciate that the description set forth herein may be equally applied to two or more planes for three dimensional measurement of motion in up to six degrees of freedom. Similarly, the present invention may also be practiced using a four beam interferometer system mounted on one interferometer block to align two moveable members.

Referring again to FIG. 4, interferometer system 20 of the present invention is illustrated in side view in the XZ plane, with the Z axis as shown representing the vertical direction. In order to clarify the schematic representation of the invention as shown in FIG. 4, the reference beams and reference mirrors for each interferometer are not shown. Thus, in a preferred embodiment, eight absolute interferometers provide eight measurement beams, 41–48 as shown.

Persons of ordinary skill in the art will appreciate that differential interferometers may be substituted in appropriate locations without departing from the scope of the invention.

In particular, beams are preferably positioned in equidistant pairs such that beam pairs 41–42, 43–44, 45–46 and 47–48 are spaced apart by a common distance (d). Moreover, adjacent beam pair 42–43 and 46–47 are preferably spaced apart at distance (e). But distances (d) and (e) could be unique for each pair without compromising the present invention. Distances (d) and (e) are preferably the same for all pairs as this simplifies the positioning determination. However, the separate pairs may be differently spaced so long as each unique spacing is known and compensated for. Additionally, distances (d) and (e) may also represent only the component of the interferometer beam spacing that is in the plane of interest. For example, since the plane of interest in FIG. 4 is the XZ plane, and also with reference to FIG. 5, interferometer 41 may be offset from interferometer 42 in the Y direction without affecting the value of (d). As will be apparent to one of ordinary skill in the art, no two interferometers may originate or terminate at the same point without resulting in a loss of the data points necessary for the invention to function as described.

The beams are also positioned with respect to a defined reference point 26 on projection lens assembly 22. Preferably reference point 26 corresponds to the vertical center of the main lens within the projection lens assembly such that the vertical distance (Z axis) of beam 44 from reference point 26 is $C_W$ and the corresponding distance from beam 45 to reference point 26 is $C_R$. Measurement beams 41–48 correspond positionally to optical path length changes $X_{1-8}$, calculated according to the invention as described in greater detail below.

In an initial state, specifically when the projection lens assembly 22 and the interferometer system 20 are not tilted, the Z axis matches optical axis 24 of lens assembly 22. According to the methodology of the present invention, projection lens assembly 22 (PL), reticle stage 40 (RS), wafer stage 30 (WS), reticle stage interferometer block 50 (RIB), and wafer stage interferometer block 60 (WIB) are treated as rigid bodies. Thus, the angle of each rigid body relative to the initial optical axis (i.e. the Z axis, perpendicular to the ground) is defined as follows:

| | |
|---|---|
| $\theta_W$ | rotation about the Y axis of wafer stage 30 |
| $\theta_L$ | rotation about the Y axis of projection lens 22 |
| $\theta_R$ | rotation about the Y axis of reticle stage 40 |
| $\theta_a$ | rotation about the Y axis of optical block 60 |
| $\theta_b$ | rotation about the Y axis of optical block 50 |

The movement distance of each rigid body from the initial position is similarly defined as follows:

| | |
|---|---|
| $u_W$ | x displacement of wafer stage 30 |
| $u_L$ | x displacement of projection lens 22 |
| $u_R$ | x displacement of reticle stage 40 |
| $u_a$ | x displacement of optical block 60 |
| $u_b$ | x displacement of optical block 50 |

Thus, the optical path length change $X_{1-8}$ measured by interferometer beams 41–48, when any or all of the five rigid bodies 22, 30, 40, 50, 60 has translated and/or rotated, may be expressed in relation to the initial state as follows:

$$X_1 = [WS\ 30\ \text{position and tilt}] + [WIB\ 60\ \text{position and tilt}] = [u_W - d\theta_W] - [u_a - (d+e/2)\theta_a] \quad (1)$$

$$X_2 = [WS\ 30\ \text{position and tilt}] + [WIB\ 60\ \text{position and tilt}] = [u_W] - [u_a - (e/2)\theta_a] \quad (2)$$

$$X_3 = [PL\ 22\ \text{position and tilt}] + [WIB\ 60\ \text{position and tilt}] = [u_L - (d+c_W)\theta_L [-u]_a + (e/2)\theta_a] \quad (3)$$

$$X_4 = [PL\ 22\ \text{position and tilt}] + [WIB\ 60\ \text{position and tilt}] = [u_L - c_W\theta_L] - [u_2 + (d+e/2)\theta_a] \quad (4)$$

$$X_5 = [PL\ 22\ \text{position and tilt}] + [RIB\ 50\ \text{position and tilt}] = [u_L + c_R\theta_L] - [u_b - (d+e/2)\theta_b] \quad (5)$$

$$X_6 = [PL\ 22\ \text{position and tilt}] + [RIB\ 50\ \text{position and tilt}] = [u_L + (d+C_R)\theta_L] - [u_b - (e/2)\theta_b] \quad (6)$$

$$\text{i } X_7 = [RS\ 40\ \text{position and tilt}] + [RIB\ 50\ \text{position and tilt}] = [u_R] - [u_b + (e/2)\theta_b] \quad (7)$$

$$X_8 = [RS\ 40\ \text{position and tilt}] + [RIB\ 50\ \text{position and tilt}] = [u_R + d\theta_R] - [u_b + (d+e/2)\theta_b] \quad (8)$$

With these relationships defined, changes in position of the optical elements can be determined. This is accomplished by first calculating the differences between adjacent interferometer beam pairs 41–42, 43–44, 45–46 and 47–48 then dividing by the separation (d) between the beams:

$$(X_2 - X_1)/d = \theta_W - \theta_a \quad (9)$$

$$(X_4 - X_3)/d = f_L - \theta_a \quad (10)$$

$$(X_6 - X_5)/d = \theta_{L\ -\theta b} \quad (11)$$

$$(X_8 - X_7)/d = \theta_{R\ -\theta b} \quad (12)$$

Equations (10) and (11) can now be substituted into the equations describing the differences between stage mirrors 31, 33 and mirrors 32, 34 on projection lens assembly 22. The resulting relationships show the differences as functions of moving member displacement and rotation:

$$\begin{aligned}
X_2 - X_3 &= [u_w] - [u_a - (e/2)\theta_a] - \\
&\quad [u_L - (d + c_w)\theta_L] + [u_a + (e/2)\theta_a] \\
&= u_w + e\theta_a - u_L + (d + c_w)\theta_L \\
(10) \rightarrow &= u_w + e(\theta_L - (X_4 - X_3)/d) - u_L + (d + c_w)\theta_L \\
&= u_w - (e/d)(X_4 - X_3) - u_L + (d + c_w + e)\theta_L
\end{aligned} \quad (13)$$

$$\begin{aligned}
X_7 - X_6 &= [u_R] - [u_b + (e/2)\theta_b] - \\
&\quad [u_L + (d + c_R)\theta_L] + [u_b - (e/2)\theta_b] \\
&= u_R - e\theta_b - u_L - (d + c_R)\theta_L \\
(11) \rightarrow &= u_R - e(\theta_L - (X_6 - X_5)/d) - u_L - (d + c_R)\theta_L \\
&= u_R + (e/d)(X_6 - X_5) - u_L - (d + c_R + e)\theta_L
\end{aligned} \quad (14)$$

These equations are then solved to express the element positions as functions of the measured optical path length changes.

$$(13) \rightarrow u_W - [u_L - (d+c_W+e)\theta_L] = X_2 - X_3 + (e/d)(X_4 - X_3) \quad (15)$$

$$(14) \rightarrow u_R - [u_L + (d+c_R+e)\theta_L] = X_7 - X_6 - (e/d)(X_6 - X_5) \quad (16)$$

$$(9) - (10) \rightarrow \theta_W - \theta_L = (X_2 - X_1)/d - (X_4 - X_3)/d \quad (17)$$

$$(12) - (11) \rightarrow \theta_R - \theta_L = (X_8 - X_7)/d - (\text{i } X_6 - X_5)/d \quad (18)$$

The left sides of equations (15) through (18) are intermediate steps that begin to show the transition from the position and angle values (u, θ) of the coordinate system created by the initial optical axis Z to the coordinate system created by the optical axis 24 of projection lens assembly 22 after movement or rotation of system elements. For example, $(d+c_W+e)$ of equation (15) is the distance from projection lens 26 to the wafer surface, so $u_W-[u_L-(d+c_W+e)\theta_L]$ shows the transition from the coordinate system created by the initial optical axis to the coordinate system created by the projection lens optical axis 24 after elements of the system have been moved and rotated. Similarly, $\theta_W-\theta_L$ of equation (17) shows the transition from angle $\theta_W$ measured from the initial optical axis Z to the relative angle between wafer stage 30 and projection lens assembly 22 after movement or rotation of system elements.

After solution these positions are still described with respect to the Z axis. But with respect to a coordinate system defined around reference point 26 (i.e. optical axis 24 of lens 26) some terms drop out ($u_L=\theta_L=0$). Therefore, using reference point 26 as a reference moveable member allows a projection system employing the present invention to position both wafer stage and reticle stage relative to the projection lens assembly (specifically reference point 26) according to the following:

| | | |
|---|---|---|
| $U_W = X_2 - X_3 + (e/d)(X_4 - X_3) =$ | wafer stage position | (19) |
| $U_R = X_7 - X_6 - (e/d)(X_6 - X_5) =$ | reticle stage position | (20) |
| $\Theta_W = (X_2 - X_1)/d - (X_4 - X_3)/d =$ | wafer stage angle | (21) |
| $\Theta_R = (X_8 - X_7)/d - (X_6 - X_5)/d =$ | reticle stage angle | (22) |

Thus, if the optical axis of projection lens assembly 22 as described above is made the reference standard, then with the eight beam interferometer system of a preferred embodiment, even if projection lens assembly 22, wafer stage 30, reticle stage 40, reticle stage interferometer block 50, and wafer stage interferometer block 60 are moved and tilted, it is possible to measure and correct for the relative movement and tilt when positioning wafer stage 30 and reticle stage 40.

As depicted, equations (19)–(22) may be viewed as having two components. The first component, a "nominal" component, determines the basic translation of the stage relative to the projection lens assembly 22. The second component, a "correction," accounts for the rotation and movement that cause the various components of the system to deviate in position from the "nominal" position. For example, in equation (19) the nominal component is "$X_2-X_3$" and the correction is "$+(e/d)(X_4-X_3)$." Similarly, in equation (21) the nominal component is "$(X_2-X_1)/d$" and the correction is "$-(X_4-X_3)/d$." These nominal and correction components are representations designed to simplify the discussion of the invention. Depending on the specific hardware and software implementation, the present invention does not necessarily differentiate between "nominal" and "correction" during either data acquisition or computation.

It will be observed from the above description that the interferometer system of the present invention provides a number of advantages over prior art systems. Importantly, the interferometer system accounts for displacement of the optical components of the interferometer system due to environmental effects such as thermal fluctuations or vibrations (or translations, since vibration can be considered translation with a time component), thus providing more accurate stage position measurement than possible with prior art interferometer systems.

Figure 5:
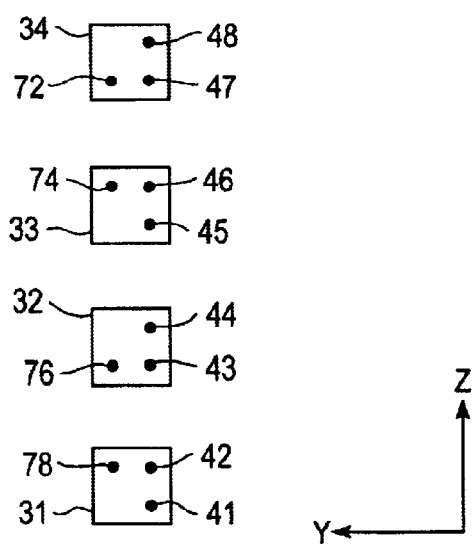
FIG. 5 is a side view showing the relative interferometer placement in a preferred embodiment of the present invention.

A further alternative embodiment of the present invention addresses rotation about the Z-axis with the addition of four interferometer reference beams 72, 74, 76, 78 as shown in FIG. 5. (FIG. 5 schematically depicts the relative position of mirrors 31–34 in the YZ plane. The interferometer beams which lie in the XZ plane therefore appear in cross-section in FIG. 5.) Each of beams 72–78 is directed to one of mirrors 31, 32, 33, 34, at a point displaced in the Y direction from the other beams already incident on each mirror. Beams 72, 74, 76, 78 are each paired with one of the other interferometer beams that is directed to the same mirror. The difference between the displacement from beams 72, 74, 76, 78 and its partner is then used as previously described to account for rotation about the Z axis of both moveable members and optical components. For example, interferometer beam 72 can be paired with either beam 47 or 48, since both are offset from beam 72 in the Y direction.

The interferometer system of the present invention may be used as a position measurement system of a stage apparatus such as a wafer stage or a mask stage in a one-shot or scan type exposure apparatus for which highly precise driving control is required. But the invention is not limited to use with an exposure apparatus. For example, it may be used to accurately measure the relative displacement between two members in various high precision tools.

As various changes could be made in the above constructions and methods without departing from the scope of the invention, it is intended that all matter contained in the above description and shown in the accompanying drawings shall be interpreted as illustrative and not in a limiting sense. In particular, although the invention is described using interferometers to supply the necessary data, any sufficiently precise method of acquiring such data would suffice.

We claim:

1. A method employing an interferometer system to determine the relative position, within a given plane, of a plurality of moveable members, wherein said interferometer system comprises at least one component supporting a plurality of interferometer measurement beams and at least two moveable members, at least one of which is a reference moveable member, the method comprising:

directing from each said at least one interferometer component at least two interferometer measurement beams toward said reference moveable member;

directing at least two interferometer measurement beams from the at least one interferometer component toward each of said at least two moveable members that are not said reference moveable member;

measuring an optical path length change of said at least four interferometer beams as a result of relative movement of said at least one interferometer component and said moveable members; and determining the relative positions of said moveable members based on said measured optical path length changes.

2. The method of claim 1 wherein said determining step determines the relative rotational positions of said moveable members.

3. The method according to claim 1, said method further comprising positioning said moveable members with respect to each other based on said determined relative positions.

4. The method according to claim 1, wherein said interferometer system positions two stages with a lens assembly disposed therebetween in a lithography system, and wherein:

a) said measuring comprises projecting at least eight interferometer beams, at least two said beams directed at the lens assembly from each said supporting interferometer component and at least two said beams directed at each said stage; and b) said determining comprises calculating the relative positions based on optical path length changes as measured by each of said at least eight interferometer beams.

5. The method of claim 1, wherein said determining comprises:
  calculating a nominal relative position based on a first selected set of measured optical path length changes; and
  calculating a correction to account for movement of the at least one interferometer system component based on a second selected set of measured optical path length changes.

6. The method of claim 5, wherein said moveable members comprise a reference moveable member and a positionable moveable member, and said interferometer measurement beams comprise two adjacent pairs of beams, the beams in each pair spaced apart by a determined spacing distance and both directed at one moveable member, wherein adjacent beams of the adjacent pair are spaced apart by a determined adjacent distance.

7. The method of claim 6, wherein said reference moveable member is a projection lens assembly of a lithography exposure system and said positionable moveable member is a stage of the exposure system.

8. The method of claim 6, wherein said calculating a nominal relative position comprises calculating the difference in optical path length change between one beam of one pair and one beam of another pair.

9. The method of claim 8, wherein said calculating a correction comprises calculating the difference between the beams directed at the reference member and multiplying said difference by the ratio of said determined adjacent distance over said determined spacing distance.

10. The method of claim 9, wherein said determining relative positions comprises adding the calculated nominal position to the correction to determine relative position of the positionable member with respect to the reference member along an axis parallel to said interferometer beams.

11. The method of claim 6, wherein said determining relative positions comprises subtracting the nominal relative position from the correction to determine relative angular position of the positionable member with respect to the reference member in a plane defined by said interferometer beams.

12. A method employing an interferometer system to determine the relative positions, within a given plane, of a plurality of movable members, wherein said interferometer system comprises at least one component supporting a plurality of interferometer measurement beams directed toward at least two moveable members, the method comprising:
  measuring optical path length change between the at least one interferometer component and said at least two moveable members along each of the plurality of interferometer beams;
  calculating a nominal relative position based on a first selected set of measured optical path length changes;
  calculating a correction to account for movement of the at least one interferometer system component based on a second selected set of measured optical path length changes; and
  determining relative positions between the moveable members based on the nominal relative positions and said correction.

13. The method of claim 12 wherein said determining step determines the relative rotational positions of said moveable members.

14. The method of claim 13, said method further comprising positioning said members based on said determined relative positions.

15. A method employing an interferometer system to determine the relative positions of a plurality of movable members with respect to a moveable reference member within a given plane, wherein said interferometer system includes at least two interferometer blocks, each block supporting a plurality of interferometer measurement beams directed at least at the reference moveable member and one other moveable member, the method comprising:
  sensing, with interferometers of a first interferometer block, the measured optical path lengths to at least two points on each of a first plurality of moveable members, said first plurality of moveable members including a first moveable member and a reference member;
  sensing, with interferometers of a second interferometer block, the measured optical path lengths to at least two points on each of a second plurality of moveable members, said second plurality of moveable members including a second moveable member and said reference member;
  calculating the positions of said first and second moveable members relative to the reference member based on (i) the measured optical path lengths between the first moveable member and the first interferometer block, (ii) the measured optical path lengths between the second moveable member and the second interferometer block and (iii) the measured optical path lengths between said first and second interferometer blocks and said reference member.

16. The method of claim 15 wherein said calculating step calculates the the relative rotational positions of said moveable members.

17. The method of claim 15, further comprising aligning said moveable members based on said calculated positions.

18. A method for controlling stage position relative to a projection lens assembly in a lithography exposure system, comprising:
  positioning a stage with respect to a projection lens assembly;
  providing an interferometer system comprising at least one interferometer component supporting a plurality of interferometer measurement beams directed at said projection lens assembly and stage, wherein said interferometer measurement beams are disposed in two adjacent pairs, one pair directed at each of the projection lens assembly and stage, the beams in each pair being spaced apart by a determined spacing distance and wherein adjacent beams of the adjacent pair are spaced apart by a determined adjacent distance;
  measuring optical path length change between the at least one interferometer component and the projection lens assembly and between the at least one interferometer component and the stage along each of the plurality of interferometer beams;
  calculating a nominal relative position of the stage with respect to the projection lens assembly based on a first selected set of measured optical path length changes;
  calculating a correction to account for movement of the at least one interferometer system component based on a second selected set of measured optical path length changes;
  determining relative positions between the stage and the projection lens assembly based on the nominal relative positions and said correction; and controlling the position of the stage with respect to the projection lens assembly in accordance with said determined relative positions.

19. The method of claim 18 wherein said determining step determines the relative rotational positions of said moveable members.

20. The method of claim 18, wherein said calculating a nominal relative position comprises calculating the optical path length change between the adjacent beams of the two adjacent pairs of beams.

21. The method of claim 20, the method further comprising designating one of the stage and the projection lens assembly as a reference member and the other as a positionable member, and wherein said calculating a correction comprises calculating the difference between the beams directed at the reference member and multiplying said difference by the ratio of said adjacent distance over said spacing distance.

22. The method of claim 21, wherein said determining relative positions comprises adding the calculated nominal position to the correction to determine relative position of the positionable member with respect to the reference member along an axis parallel to said interferometer beams.

23. The method of claim 21, wherein said determining relative positions comprises adding the correction to the nominal to determine relative angular position of the positionable member with respect to the reference member in a plane defined by said interferometer beams.

24. A system for relative positioning of moveable members in a reference plane, comprising:
a first moveable member having a first measurement mirror attached thereto;
a second moveable member having a second measurement mirror attached thereto;
a third moveable member having at least a third measurement mirror attached thereto;
a plurality of interferometers including a plurality of reference mirrors and providing a plurality of measurement beams and a plurality of reference beams to measure optical path length changes;
a first optical support block supporting a plurality of said interferometers wherein at least two of said interferometer measurement beams are directed to points on said first measurement mirror and at least two interferometer measurement beams are directed to points on said third measurement mirror and wherein each of said measurement beams is paired with one of said reference beams to provide a signal representing the path length to said measurement mirror;
a second optical support block supporting a plurality of said interferometers wherein at least two of said interferometer measurement beams are directed to points on said second measurement mirror and at least two interferometer measurement beams are directed to points on said third measurement mirror and wherein each of said measurement beams is paired with one of said reference beams to provide a signal representing the path length to said measurement mirror;
a plurality of sensors for receiving each of said signals; and
at least one controller cooperating with at least each of the first and second moveable members to position at least one of said members with respect to the third moveable member in response to the sensed signals.

25. The system for positioning moveable members of claim 24 wherein said at least one controller rotationally positions at least one of said members with respect to the third moveable member in response to the sensed signals.

26. The system of claim 24, wherein said third measurement mirror comprises at least two separate mirrors spaced apart in the reference plane.

27. The system of claim 24, further comprising:
a computer program product for use in conjunction with a computer system, the computer program product comprising a computer readable storage medium and a computer program mechanism embedded therein, the computer program mechanism further comprising;
means for receiving data from said interference patterns; and
means for calculating a first position of said first moveable member and a second position of said second moveable member, both with respect to said third moveable member wherein both first and second said positions account for movements of a plurality of interferometer elements and moveable members based on said interference patterns.

28. The system of claim 24, wherein:
said first moveable member comprises a reticle stage, said second moveable member comprises a wafer stage, and said third moveable member comprises a projection lens assembly including a projection lens; and
the interferometer measurement beams from each optical support block are disposed in two adjacent pairs, one pair directed at each of the projection lens assembly and one said stage, the beams in each pair being spaced apart by a spacing distance, and wherein adjacent beams of the adjacent pair are spaced apart by an adjacent distance.

29. The system of claim 28 wherein the wafer stage is positioned relative to the projection lens assembly according to the following relationship:

$$U_W = X_2 - X_3 + (e/d)(X_4 - X_3)$$

wherein,
$U_W$ corresponds to displacement of the wafer stage relative to the projection lens assembly along an axis parallel to the measurement beams,
$X_2$ corresponds to the optical path length change measured by the beam directed at the wafer stage which is the adjacent distance from the beam directed at the projection lens assembly,
$X_3$ corresponds to the optical path length change measured by the beam directed at the projection lens assembly which is the adjacent distance from the beam directed at the wafer stage, and
$X_4$ corresponds to the optical path length change measured by the beam directed at the projection lens assembly that is the spacing distance from the beam corresponding to $X_3$.

30. The system of claim 28 wherein the wafer stage is positioned relative to the projection lens assembly according to the following relationship:

$$U_R = X_7 - X_6 - (e/d)(X_6 - X_5)$$

wherein,
$U_R$ corresponds to displacement of the reticle stage relative to the projection lens assembly along an axis parallel to the measurement beams,
$X_7$ corresponds to the optical path length change measured by the beam directed at the reticle stage which is the adjacent distance from the beam directed at the projection lens assembly, $X_8$ corresponds to the optical path length change measured by the beam directed at the reticle stage which is the spacing distance from the beam corresponding to $X_7$, $X_6$ corresponds to the optical path length change measured by the beam directed at the projection lens assembly that is the adjacent distance from the beam corresponding to $X_7$, $X_5$ corresponds to the optical path length change measured by the beam directed at the projection lens assembly that is the spacing distance from the beam corresponding to $X_6$.

31. The system of claim 28 wherein the wafer stage is positioned relative to the projection lens assembly according to the following relationship:

$$\Theta_W = (X_2 - X_1)/d - (X_4 - X_3)/d$$

wherein, $\Theta_W$ corresponds to rotation the wafer stage relative to the projection lens assembly along an axis perpendicular to the reference plane, $X_2$ corresponds to the optical path length change measured by the beam directed at the wafer stage which is the adjacent distance from the beam directed at the projection lens assembly, $X_1$ corresponds to the optical path length change measured by the beam directed at the wafer stage which is the spacing distance from the beam corresponding to $X_2$, $X_3$ corresponds to the optical path length change measured by the beam directed at the projection lens assembly that is the adjacent distance from the beam corresponding to $X_2$, and $X_4$ corresponds to the optical path length change measured by the beam directed at the projection lens assembly that is the spacing distance from the beam corresponding to $X_3$.

32. The system of claim 28 wherein the wafer stage is positioned relative to the projection lens assembly according to the following relationship:

$$\Theta_R = (X_8 - X_7)/d - (X_6 - X_5)/d$$

wherein, $\Theta_R$ corresponds to rotation the reticle stage relative to the projection lens assembly along an axis perpendicular to the reference plane, $X_7$ corresponds to the optical path length change measured by the beam directed at the reticle stage which is the adjacent distance from the beam directed at the projection lens assembly, $X_8$ corresponds to the optical path length change measured by the beam directed at the reticle stage which is the spacing distance from the beam corresponding to $X_7$, $X_6$ corresponds to the optical path length change measured by the beam directed at the projection lens assembly that is the adjacent distance from the beam corresponding to $X_7$, $X_5$ corresponds to the optical path length change measured by the beam directed at the projection lens assembly that is the spacing distance from the beam corresponding to $X_6$.

33. A method for controlling stage position relative to a projection lens assembly in a lithography exposure system, comprising:

positioning a plurality of moveable members with respect to one another, said moveable members comprising a stage and a projection lens assembly;

providing an interferometer system comprising an interferometer block supporting a first plurality of interferometer measurement beams directed at said projection lens assembly and a second plurality of interferometer measurement beams directed at said stage;

measuring optical path length change between said interferometer block and said projection lens assembly and between said interferometer block and said stage along each of said plurality of interferometer beams;

calculating a correction to account for movement of said interferometer system block based on a selected set of measured optical path length changes;

determining relative positions between said projection lens assembly and said stage based on said correction; and controlling relative positions between said projection lens assembly and said stage based on said determined relative positions.

34. The method of claim 33, said plurality of moveable members further comprising a second stage and:

said providing further comprising providing a second interferometer block supporting a third plurality of interferometer measurement beams directed at said projection lens assembly and a fourth plurality of interferometer measurement beams directed at said second stage;

said measuring further comprising measuring optical path length change between said second interferometer block and said projection lens assembly and between said interferometer block and said second stage along each of said plurality of interferometer beams;

said calculating further comprises calculating a correction to account for movement of said second interferometer system block based on a selected set of measured optical path length changes;

said determining further comprises determining relative positions between said projection lens assembly and said second stage based on said correction; and said controlling further comprises controlling relative positions between said projection lens assembly and said second stage based on said determined relative positions.

35. An apparatus, comprising a projection system configured to project along a projection axis;

a stage;

an interferometer system configured to generate:
   a first set of beams between the interferometer system and the projection system, the first set of beams being configured to detect movement of the projection system in all degrees of freedom except along the projection axis; and
   a second set of beams between the interferometer system and the stage, the second set of beams being configured to detect movement of the stage in all degrees of freedom except along the projection axis; and a control system, coupled to the interferometer system, and configured to maintain the projection system and stage in relative alignment in all degrees of freedom except along the projection axis.

36. The apparatus of claim 35, wherein the first set of beams comprises a first sub-set of beams and a second sub-set of beams, the first sub-set of beams and the second sub-set of beams both being perpendicular to the projection axis respectively.

37. The apparatus of claim 36, wherein the interferometer system further comprises a first interferometer configured to generate the first sub-set of beams, the first sub-set of beams being configured to detect movement of the projection system in a first direction and along a first axis on a plane perpendicular to the projection axis, rotation around the projection axis, and tilt about a second axis that is perpendicular to the projection axis and the first direction.

38. The apparatus of claim 37, wherein the interferometer system further comprises a second interferometer configured to generate the second sub-set of beams, the second sub-set of beams being configured to detect movement of the projection system in a second direction along the second axis on the plane perpendicular to the projection axis, rotation around the projection axis, and tilt about the first axis that is perpendicular to the projection axis and the second axis.

39. The apparatus of claim 35, wherein the second set of beams comprises a first sub-set of beams and a second sub-set of beams, the first sub-set of beams and the second sub-set of beams both being perpendicular to the projection axis respectively.

40. The apparatus of claim 39, wherein the interferometer system further comprises a first interferometer configured to generate the first sub-set of beams, the first sub-set of beams being configured to detect movement of the stage in a first direction and along a first axis on a plane perpendicular to the projection axis, rotation around the projection axis, and tilt about a second axis that is perpendicular to the projection axis and the first direction.

41. The apparatus of claim 40, wherein the interferometer system further comprises a second interferometer configured to generate the second sub-set of beams, the second sub-set of beams being configured to detect movement of the stage in a second direction along the second axis on the plane perpendicular to the projection axis, rotation around the projection axis, and tilt about the first axis that is perpendicular to the projection axis and the second axis.

42. The apparatus of claim 35, wherein the stage is a wafer stage.

43. The apparatus of claim 35, wherein the stage is a reticle stage.

* * * * *